(12) United States Patent
Feng

(10) Patent No.: US 11,627,671 B2
(45) Date of Patent: Apr. 11, 2023

(54) FOLDABLE DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventor: Zikang Feng, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 82 days.

(21) Appl. No.: 17/261,477

(22) PCT Filed: Nov. 17, 2020

(86) PCT No.: PCT/CN2020/129335
§ 371 (c)(1),
(2) Date: Jan. 19, 2021

(87) PCT Pub. No.: WO2022/057069
PCT Pub. Date: Mar. 24, 2022

(65) Prior Publication Data
US 2022/0159845 A1    May 19, 2022

(30) Foreign Application Priority Data
Sep. 16, 2020 (CN) .......................... 202010970645.3

(51) Int. Cl.
*H05K 5/02* (2006.01)
*H05K 5/00* (2006.01)

(52) U.S. Cl.
CPC ......... *H05K 5/0017* (2013.01); *H05K 5/0226* (2013.01)

(58) Field of Classification Search
CPC combination set(s) only.
See application file for complete search history.

(56) References Cited

U.S. PATENT DOCUMENTS 9,348,450 B1    5/2016    Kim
10,480,225 B1 *  11/2019   Hsu ........................... E05D 3/12
(Continued)

FOREIGN PATENT DOCUMENTS

CN    106205385 A    12/2016
CN    107505979 A    12/2017
(Continued)

*Primary Examiner* — Hung S. Bui
(74) *Attorney, Agent, or Firm* — The Roy Gross Law Firm, LLC; Roy Gross

(57) ABSTRACT

A foldable display device includes a flexible display, an intermediate casing, two support housings disposed on two opposite sides of the intermediate casing, respectively, and a rotating assembly. One end of the rotating assembly is rotatably connected to a corresponding one of the support housings, and another end is a free end extending to an inside of the intermediate casing. The free end of the rotating assembly rotates in a direction adjacent to an inner wall of the intermediate casing when folding the foldable display device, so that the rotation of the two rotating assemblies allows for a collision avoidance space for accommodating a bend end of the flexible display.

10 Claims, 9 Drawing Sheets

(56) References Cited

U.S. PATENT DOCUMENTS

2017/0142240 A1   5/2017  Xu
2021/0352812 A1*  11/2021 Park ..................... G06F 1/1681

FOREIGN PATENT DOCUMENTS

| CN | 208651418 U | 3/2019 |
|---|---|---|
| CN | 208689845 U | 4/2019 |
| CN | 109780403 A | 5/2019 |
| CN | 110428730 A | 11/2019 |
| CN | 110767098 A | 2/2020 |
| CN | 110769090 A | 2/2020 |
| CN | 111508370 A | 8/2020 |
| WO | 2019135799 A1 | 7/2019 |

* cited by examiner

FOLDABLE DISPLAY DEVICE

CROSS REFERENCE TO RELATED APPLICATIONS

This application is a National Phase of PCT Patent Application No. PCT/CN2020/129335 having International filing date of Nov. 17, 2020, which claims the benefit of priority of Chinese Application No. 202010970645.3 filed Sep. 16, 2020. The contents of the above applications are all incorporated by reference as if fully set forth herein in their entirety.

BACKGROUND OF INVENTION

1. Field of Invention

The present invention relates to a technical field of displays, and particularly to, a foldable display device.

2. Related Art

Compared with traditional display devices, foldable display devices have advantages of being foldable in half and being lighter and thinner, which has become the development trend of display devices. Foldable display devices generally have a forward folded state, a reverse folded state, and an unfolded state. The foldable display devices generally include flexible displays and support elements for supporting the flexible displays. The foldable display devices can be switched among the forward folded state, the reverse folded state, and the unfolded state by changing shape and positions of the support elements.

Specifically, when the foldable display devices are in the forward folded state, the support elements are located at two sides of the flexible displays after being folded up. When the foldable display devices are in the reverse folded state, the support elements are located in between the flexible displays after being folded up. When the foldable display devices are in the forward folded state, bend portions of the flexible displays tend to be crushed by the support elements, causing damage to the flexible displays and failure to display normally.

Therefore, a mismatch between surfaces of the support elements and size of the flexible displays before and after bending is a major problem that needs to be solved urgently for foldable display devices.

SUMMARY OF INVENTION

An object of the present invention is to provide a foldable display device to overcome a technical problem in prior art that bend portions of flexible displays tend to be crushed by support elements when foldable display devices are in a state of being folded in half, causing damage to the flexible displays, thereby adversely affecting display performance.

In order to overcome the above-mentioned problem, an embodiment of the present invention provides a foldable display device, comprising a flexible display; an intermediate casing disposed on a side of the flexible display away from a display surface of the flexible display; two support housings disposed on two opposite sides of the intermediate casing, respectively, and each of the support housings rotatably connected to the intermediate casing; and a rotating assembly disposed between the intermediate casing and each of the support housings, wherein one end of the rotating assembly is rotatably connected to a corresponding one of the support housings, another end is a free end extending to an inside of the intermediate casing, and the support housings and the rotating assemblies cooperatively support the flexible display; wherein the two support housings are rotatable about the intermediate casing, the rotating assembly is rotatable with respect to the corresponding one of the support housings and the intermediate casing, and the free end of the rotating assembly rotates in a direction adjacent to an inner wall of the intermediate casing when folding the foldable display device, so that the rotation of the two rotating assemblies allows for a collision avoidance space for accommodating a bend end of the flexible display; wherein the rotating assembly is accommodated in a space formed by the corresponding one of the support housings and the intermediate casing, and the rotating assembly comprises a support plate configured to support the flexible display, wherein one end of the support plate is rotatably connected to the corresponding one of the support housings, and another end extends to the inside of the intermediate casing.

In one embodiment of the present invention, the foldable display device further comprises a bend area and a non-bend area, wherein the bend area includes an inward-bend area and two outward-bend areas located at two sides of the inward-bend area, part of the flexible display located in the inward-bend area bends in a direction of the display surface, and part of the flexible display located in the outward-bend areas bends in a direction facing away from the display surface.

In one embodiment of the present invention, a hard layer is disposed on a side of the flexible display facing away from the display surface, and the hard layer comprises a first hard layer located in the non-bend area, a second hard layer located in the inward-bend area, and a third hard layer located in the outward-bend area, wherein the first hard layer is arranged on an entire surface of the non-bend area, the second hard layer is configured with at least a through hole, and the third hard layer is configured with at least a blind hole.

In one embodiment of the present invention, the non-bend area comprises a first non-bend area and a second non-bend area, one end of the inward-bend area is connected to the outward-bend area on a same side on which the inward-bend area is located through the first non-bend area, a first adhesive material is applied between part of the first hard layer located in the second non-bend area and a top surface of a correspond one of the support housings, and a second adhesive material is applied between part of the first hard layer located in the first non-bend area and the corresponding one of the support plates.

In one embodiment of the present invention, a vertical distance between an end portion of the first adhesive material adjacent to the outward-bend area and an end portion of the adjacent third hard layer is between −3 and 3 millimeters (mm), a vertical distance between an end portion of the second adhesive material adjacent to the outward-bend area and an end portion of the adjacent third hard layer is between −3 and 3 mm, and a vertical distance between an end portion of the second adhesive material adjacent to the inward-bend area and an end portion of the adjacent second hard layer is between −5 and 3 mm.

In one embodiment of the present invention, each of the support housings is provided with an arc-shaped slide groove therein, and the support plate comprises an arc-shaped end portion matching the arc-shaped slide groove, so that the arc-shaped end portion is slidable along the arc-shaped slide groove, and the support plate has a rotation center defined as a center of the arc-shaped slide groove.

In one embodiment of the present invention, the rotating assembly further comprises a rotation plate rotatably connected to the support plate, one end of the rotation plate is rotatably connected to the intermediate casing, and the support plate rotates against the rotation plate in a linear direction.

In one embodiment of the present invention, each of the support housings is pivotally connected to the intermediate casing, and the rotation plate is pivotally connected to the intermediate casing.

An embodiment of the present invention further provides a foldable display device, comprising a flexible display; an intermediate casing disposed on a side of the flexible display away from a display surface of the flexible display; two support housings disposed on two opposite sides of the intermediate casing, respectively, and each of the support housings rotatably connected to the intermediate casing; and a rotating assembly disposed between the intermediate casing and each of the support housings, wherein one end of the rotating assembly is rotatably connected to a corresponding one of the support housings, another end is a free end extending to an inside of the intermediate casing, and the support housings and the rotating assemblies cooperatively support the flexible display; wherein the two support housings are rotatable about the intermediate casing, the rotating assembly is rotatable with respect to the corresponding one of the support housings and the intermediate casing, and the free end of the rotating assembly rotates in a direction adjacent to an inner wall of the intermediate casing when folding the foldable display device, so that the rotation of the two rotating assemblies allows for a collision avoidance space for accommodating a bend end of the flexible display.

In one embodiment of the present invention, the rotating assembly is accommodated in a space formed by the corresponding one of the support housings and the intermediate casing.

In one embodiment of the present invention, the rotating assembly comprises a support plate configured to support the flexible display, one end of the support plate is rotatably connected to the corresponding one of the support housings, and another end extends to the inside of the intermediate casing.

In one embodiment of the present invention, the foldable display device further comprises a bend area and a non-bend area, wherein the bend area includes an inward-bend area and two outward-bend areas located at two sides of the inward-bend area, part of the flexible display located in the inward-bend area bends in a direction of the display surface, and part of the flexible display located in the outward-bend areas bends in a direction facing away from the display surface.

In one embodiment of the present invention, a hard layer is disposed on a side of the flexible display facing away from the display surface, and the hard layer comprises a first hard layer located in the non-bend area, a second hard layer located in the inward-bend area, and a third hard layer located in the outward-bend area, wherein the first hard layer is arranged on an entire surface of the non-bend area, the second hard layer is configured with at least a through hole, and the third hard layer is configured with at least a blind hole.

In one embodiment of the present invention, the non-bend area comprises a first non-bend area and a second non-bend area, one end of the inward-bend area is connected to the outward-bend area on a same side on which the inward-bend area is located through the first non-bend area, a first adhesive material is applied between part of the first hard layer located in the second non-bend area and a top surface of a correspond one of the support housings, and a second adhesive material is applied between part of the first hard layer located in the first non-bend area and the corresponding one of the support plates.

In one embodiment of the present invention, a vertical distance between an end portion of the first adhesive material adjacent to the outward-bend area and an end portion of the adjacent third hard layer is between −3 and 3 millimeters (mm), a vertical distance between an end portion of the second adhesive material adjacent to the outward-bend area and an end portion of the adjacent third hard layer is between −3 and 3 mm, and a vertical distance between an end portion of the second adhesive material adjacent to the inward-bend area and an end portion of the adjacent second hard layer is between −5 and 3 mm.

In one embodiment of the present invention, the support plate has a free end extending to the intermediate casing, and the free end of the support plate rotates in the direction adjacent to the inner wall of the intermediate casing when folding the foldable display device.

In one embodiment of the present invention, each of the support housings is provided with an arc-shaped slide groove therein, and the support plate comprises an arc-shaped end portion matching the arc-shaped slide groove, so that the arc-shaped end portion is slidable along the arc-shaped slide groove, and the support plate has a rotation center defined as a center of the arc-shaped slide groove.

In one embodiment of the present invention, the arc-shaped slide groove is fixedly connected to a top surface of the support housing.

In one embodiment of the present invention, the rotating assembly further comprises a rotation plate rotatably connected to the support plate, one end of the rotation plate is rotatably connected to the intermediate casing, and the support plate rotates against the rotation plate in a linear direction.

In one embodiment of the present invention, each of the support housings is pivotally connected to the intermediate casing, and the rotation plate is pivotally connected to the intermediate casing.

The present invention has advantageous effects as follows: each of the support plates rotates with respect to the corresponding one of the support housings when folding the foldable display device in half, so that the two support plates on two sides of the intermediate casing tilt to be wedge-like in shape to form a collision avoidance space for accommodating the bend end of the flexible display, thereby reducing damage to the flexible display due to crush. In addition, part of each of the support plates is kept in a straight adhesion state with the flexible display to provide well support for the flexible display when the foldable display device is being folded in half, and the support plates after being expanded are configured to provide an entire surface support for the bend area of the flexible display when the foldable display device is in an expanded state. Furthermore, a rear surface of the flexible display is provided with the hard layer, which is formed with a through hole pattern structure corresponding to position of the inward-bend area. In addition, the hard layer in the outward-bend area is processed to reduce thickness or is formed with a blind hole pattern structure, so that the hard layer in both the inward-bend area and the outward-bend area can meet requirements for bending in various directions.

DESCRIPTION OF PREFERRED EMBODIMENTS

The present invention provides a foldable display device. In order to make the objectives, technical solutions, and effects of the present invention clearer, the present invention will be further described in detail below with reference to the accompanying drawings and embodiments. It should be understood that the specific embodiments described here are only used to explain the present invention, but not to limit the present invention.

Figure 1:
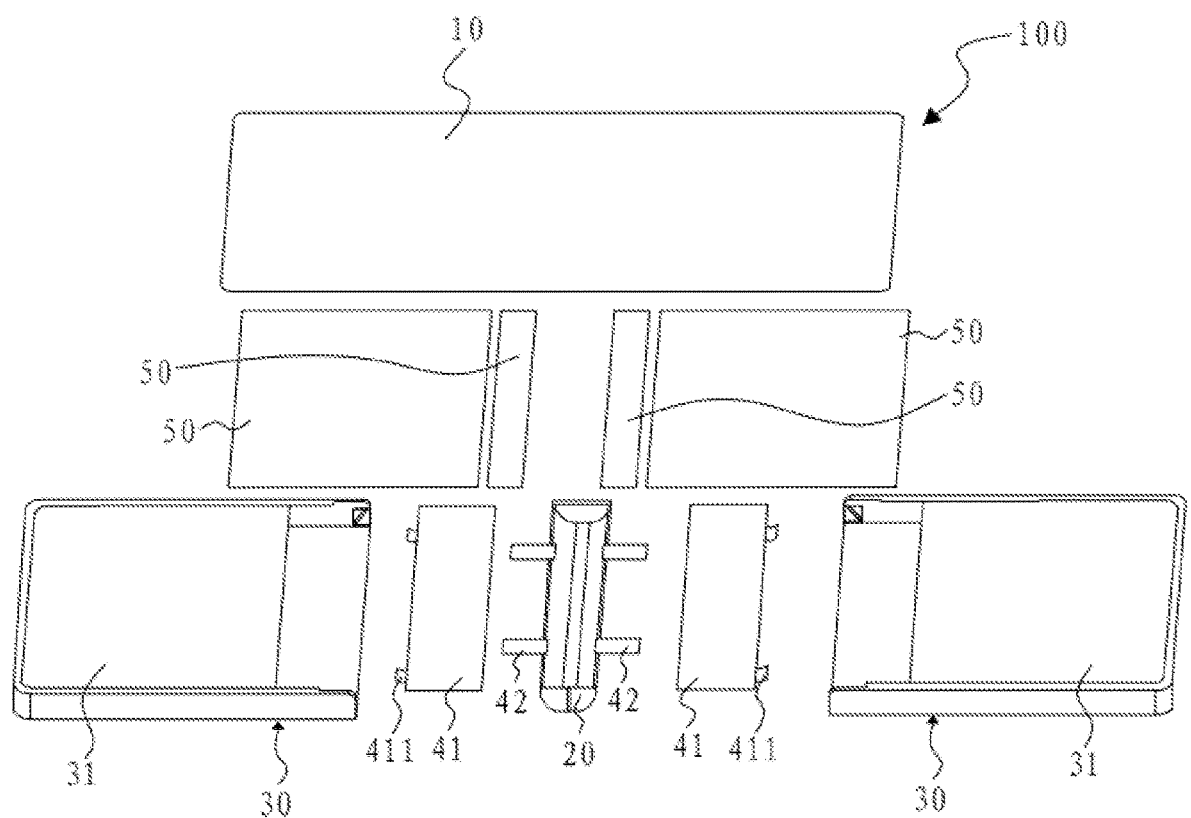
FIG. 1 is a schematic exploded view of a foldable display device in accordance with an embodiment of the present invention.
Figure 2:
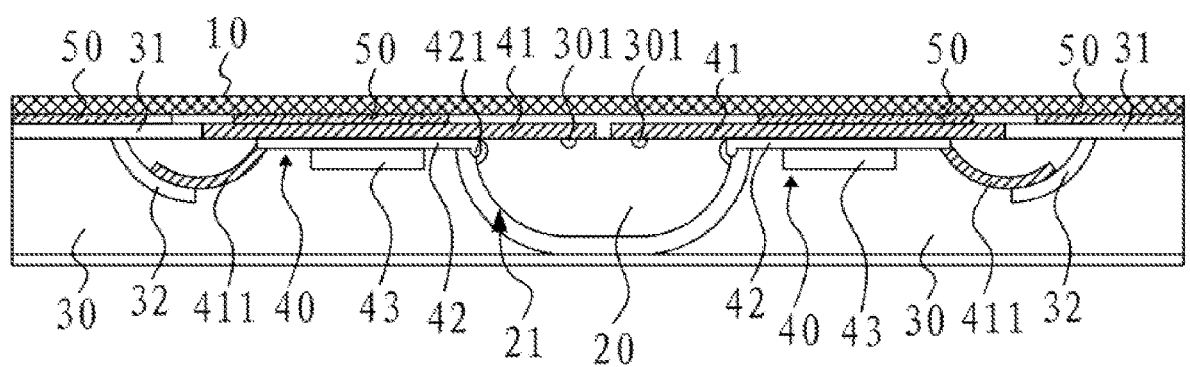
FIG. 2 is a schematic view showing a foldable display device in an expanded state in accordance with an embodiment of the present invention.

Please refer to FIGS. 1 and 2. An embodiment of the present invention provides a foldable display device 100 including a flexible display 10, an intermediate casing 20 disposed on a side of the flexible display away from a display surface of the flexible display, two support housings 30, and two rotating assemblies 40.

Specifically, the two support housings 30 are disposed on two opposite sides of the intermediate casing 20, respectively. Each of the support housings 30 is rotatably connected to the intermediate casing 20, so that the two support housing 30 are rotatable about the intermediate casing 20.

The rotating assemblies 40 are disposed between the intermediate casing 20 and each of the support housings 30, respectively. One end of the rotating assembly 40 is rotatably connected to a corresponding one of the support housings 30, another end of the rotating assembly 40 is a free end extending to an inside of the intermediate casing 20, and the rotating assembly 40 is rotatable with respect to the corresponding one of the support housings 30 and the intermediate casing 20.

The two support housings 30 and the two rotating assemblies 40 cooperatively support the flexible display 10. The free end of the rotating assembly 40 rotates in a direction adjacent to an inner wall of the intermediate casing 20 when folding the foldable display device 100, so that the rotation of the two rotating assemblies 40 allows for a collision avoidance space for accommodating a bend end 11 of the flexible display 10.

The rotating assembly 40 is accommodated in a space formed by the corresponding one of the support housings 30 and the intermediate casing 20.

In one embodiment, the support housing 30 is a semi-closed chamber (that is, part of an area above the support housing 30 is configured with an unclosed opening). The intermediate casing 20 is an open cavity. The support housing 30 has a top surface 31 for supporting the flexible display 10. The top surface 31 corresponds to a non-bend part of the flexible display.

Please refer to FIG. 2. When the foldable display device 100 is in an expanded state, the top surface 31 of the intermediate casing is flush with top surfaces of the two rotating assemblies 40, so that a flat surface is shaped to support the flexible display 10.

Figure 3:
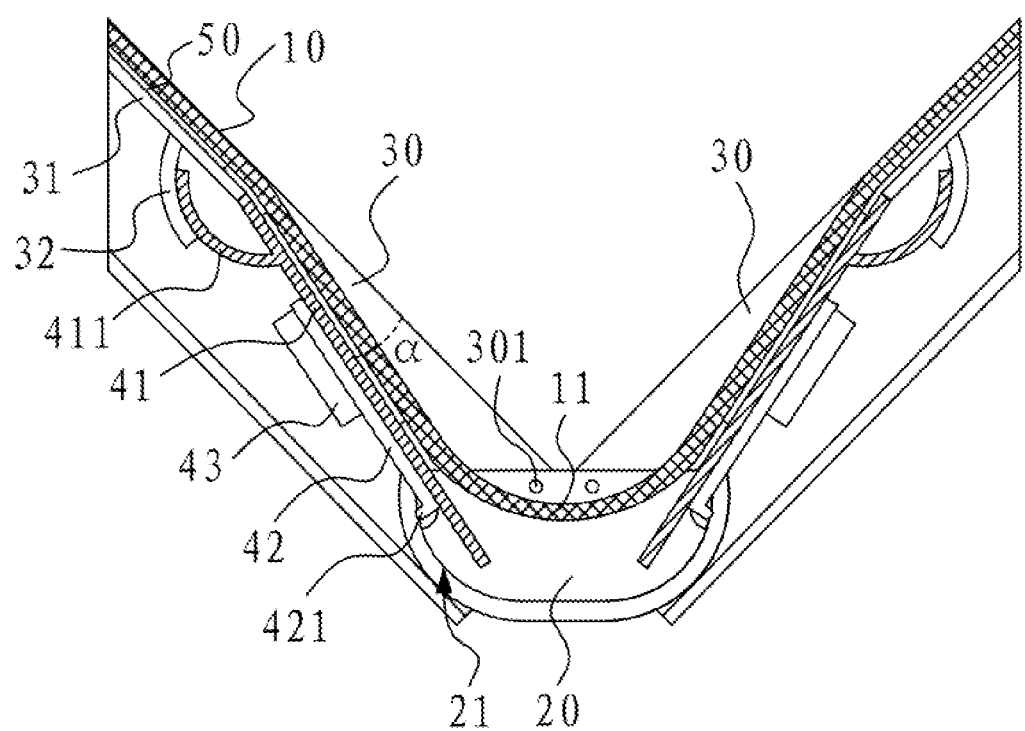
FIG. 3 is a schematic view showing a foldable display device in a bent state in accordance with an embodiment of the present invention.
Figure 4:
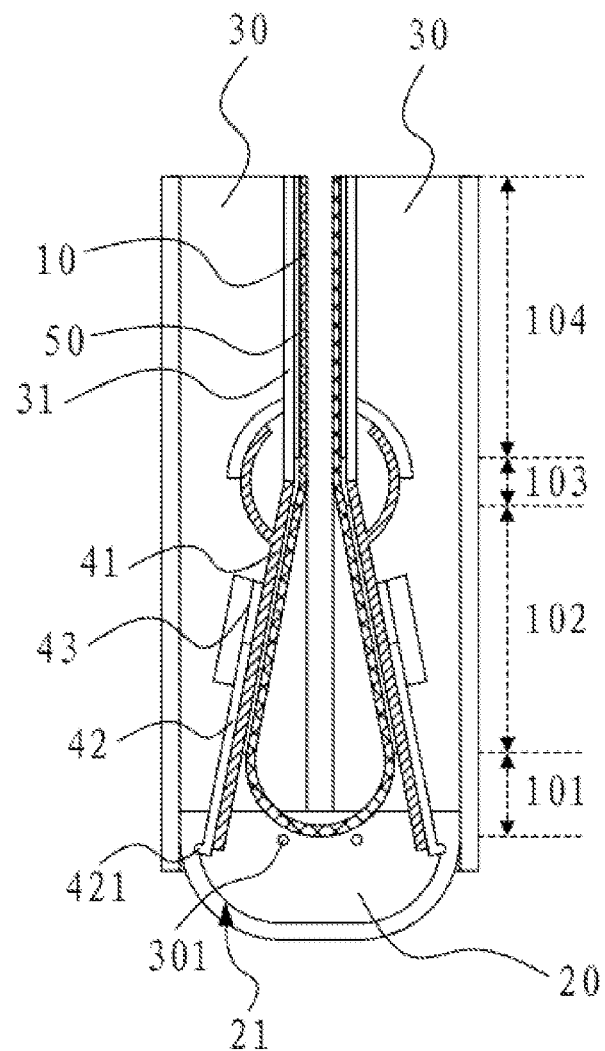
FIG. 4 is a schematic view showing a foldable display device in a bent state in accordance with another embodiment of the present invention.

Please refer to FIGS. 3 and 4. When folding the foldable display device 100, the two support housings 30 rotate upwards about the intermediate casing 20 and drive each of the rotating assemblies 40 to rotate with respect to a corresponding one of the support housings 30 and the intermediate casing 20, wherein the rotation of the two rotating assemblies 40 allows for the collision avoidance space for accommodating the bend end 11 of the flexible display 10.

In one embodiment, a rotation angle of the two support housings 30 is between zero degree and 90 degrees. When the foldable display device 100 rotates from the expanded state to a folded-up state, the two support housings 30 rotate towards each other about the intermediate casing 20. When the foldable display device 100 rotates from the folded-up state to the expanded state, the two support housings 30 rotate away from each other about the intermediate casing 20.

In one embodiment, the two support housings 30 are pivotally connected to two opposite ends of the intermediate casing 20, respectively. Each of the support housings 30 rotates about a rotation center 301 thereof. Specifically, the support housings 30 are hingedly connected to the intermediate casing 20, or other manners of pivotal connection.

The flexible display 10 of the disclosed embodiment is an inward-bend type display. The two support housings 30 are symmetrically rotatable about the intermediate casing 20. That is, there may be a linkage relationship between the support housings 30 on two opposite sides of the intermediate casing. Specifically, when one of the support housings 30 is rotating, the other one is driven to rotate at a same rotation angle in an opposite direction, thereby ensuring that the foldable display device 100 keeps a state of being symmetrical in shape during an entire bending process, and reducing damage to the flexible display 10 by other components.

Specifically, one of the support housings 30 located on a left side rotates clockwise about the rotation center 301 in an upward direction, the rotating assembly 40 located on the left side rotates clockwise about a rotation center of the rotating assembly in a downward direction, the free end of the rotating assembly 40 located on the left side rotates in a direction adjacent to an inner wall 21 of the intermediate casing 20, thereby enabling the rotating assembly 40 after rotation to tilt with respect to the corresponding one of the support housings 30, wherein the rotating assembly 40 rotates at a rotation angle $\alpha$, which is an acute angle. The other one of the support housings 30 located on a right side and its corresponding rotating assembly 40 and other components on the right side rotate in a symmetrical rotation relationship with the components on the left side, so that a collision avoidance space is provided for the bend end 11 of the flexible display 10.

In one embodiment, please refer to FIGS. 2 to 4. The rotating assembly 40 includes a support plate 41 configured to support the flexible display 10. One end of the support plate 41 is rotatably connected to a corresponding one of the support housings 30, and another end extends to the inside of the intermediate casing 20, wherein an end of the support plate 41 located inside the intermediate casing 20 rotates downwards (in a direction away from the flexible display 10).

Specifically, the support plate 41 has a free end extending to the inside of the intermediate casing 20. The free end of the support plate 41 rotates in the direction adjacent to the inner wall 201 of the intermediate casing 20 when folding the foldable display device.

In one embodiment, the support plate 41 may be hingedly connected to the support housing 30, and is in a linkage relationship with the support housing 30. The support plate 41 is driven to rotate downwards when the support housing 30 rotates upwards, thereby forming the collision avoidance space for the flexible display 10.

In one embodiment, each of the support housings 30 is provided with an arc-shaped slide groove 32 therein, and the corresponding support plate 41 has an arc-shaped end portion 411 matching the arc-shaped slide groove 32, so that the arc-shaped end portion 411 is slidable along the arc-shaped slide groove 32. The support plate 41 has a rotation center defined as a center of the arc-shaped slide groove 32.

The arc-shaped slide groove 32 is varied in position in conjunction with rotation of the support housing 30 in an upward direction, so that the arc-shaped end portion 411 is driven to slide in a direction adjacent to the arc-shaped slide groove 32, thereby driving the free end of the support plate 41 to rotate in a downward direction.

In one embodiment, the arc-shaped slide groove 32 is fixedly connected to the top surface 31, or may be connected to a side wall of the support housing 30, but is not limited thereto.

In one embodiment, the support plate further includes a horizontal end portion connected to the arc-shaped end portion 411. The horizontal end portion is located adjacent to the top surface 31 and is configured to provide an additional support surface for the flexible display.

In one embodiment, the rotating assembly 40 further includes a rotation plate 42, wherein one end of the rotation plate 42 is rotatably connected to the intermediate casing 20, and the rotation plate 42 rotates about a rotation center 421 of the rotation plate 42.

The rotation plate 42 may be pivotally connected to the intermediate casing 20, in a way of hinged connection in specific, or other pivotal connection.

Furthermore, the rotation plate 42 is slidably connected to the support plate 41. The support plate 41 rotates against the rotation plate 42 in a linear direction, so the rotation plate 42 and the support plate 41 rotate at a same rotation angle but in opposite directions.

In one embodiment, the rotation plate 42 and the support plate 41 may be connected to each other through a slide groove 43, or other sliding connection manners. Specifically, the slide groove 43 may be a linear slide groove.

When folding the foldable display device 100, each of the two support housings 30 rotates about its corresponding rotation center 301 with respect to the intermediate casing 20, the rotation plate 42 rotates about the rotation center 421 with respect to the intermediate casing 20, and the support plate 41 simultaneously rotates about the rotation center of the support plate with respect to a corresponding one of the support housings 30.

Since the support plate 41 and the rotation plate 42 are slidably connected, an angle formed by the support plate 41 and the support housing 30 is always the same as an angle formed by the rotation plate 42 and the support housing 30.

Since the rotation center of the rotation plate 42 rotating with respect to the corresponding one of the support housings 30 is in a position different from a position of the rotation center of the rotation plate 42 rotating with respect to the intermediate casing 20, a rotation angle between the rotation plate 42 and the corresponding support housing 30 is different form a rotation angle between the corresponding support housing 30 and the intermediate casing 20, causing the support plate 41 to tilt at an a certain tilting angle with respect to the support housing, wherein the tilting angle is determined by a position of the rotation center 421 of the rotation plate 42 with respect to the intermediate casing 20, a position of the rotation center 301 of the supporting housing 30 with respect to the intermediate casing 20, and a position of the rotation center of the support plate 41 with respect to the support housing 30. Therefore, when the two support housings 30 rotate with respect to the intermediate casing 20, the support plate 41 tilts downwards to make space for the flexible display 10. After the foldable display device 100 is completely folded up, the two support plates 41 are opened in a wedge shape, which allows for a water-drop shape of the flexible display 10 in a bend area.

The foldable display device 100 includes a bend area and a non-bend area. The bend area includes an inward-bend area 101 and two outward-bend areas 103 located at two sides of the inward-bend area 101. Part of the flexible display 10 located in the inward-bend area 101 bends in a direction of a display surface of the flexible display, and part of the flexible display 10 located in the outward-bend areas 103 bends in a direction facing away from the display surface.

The non-bend area includes a first non-bend area 102 and a second non-bend area 104. One end of the inward-bend area 101 is connected to the outward-bend area 103 on a same side on which the inward-bend area 101 is located through the first non-bend area 102. The first non-bend area 102 and the second non-bend area 104 are connected to each other through the outward-bend area 103.

An adhesive material 50 is provided between the flexible display 10 and the top surface 31 of the support housing 30, as well as between the flexible display 10 and the support plate 41, and is further provided in the non-bend area.

Since the rotation center of the support plate 41 and the rotation center of the support housing 30 are in different positions, one end of the support plate 41 is located at a certain angle with respect to the support housing 30 when bending the foldable display device, and the other end of the support plate 41 is away and spaced apart from the flexible display 10, so that the flexible display 10 bends from an area between the two ends of the support plate 41 and is spaced apart and away from the support plate 41. As a result, two ends of a support surface of the support plate 41 are not provided with the adhesive material, but other contact areas between the support plate 41 and the flexible display 10 may be provided with the adhesive material 50. Specifically, an area where the support plate 41 is adhesively attached to the flexible display 10 is kept in a straight adhesion state when being bent, thereby remedying a problem that part of the flexible display 10 protrudes corresponding to position of the support plate after being bent or expanded.

In one embodiment, a length of the adhesive material 50 may be limited to 3 millimeters (mm) to 15 mm.

Figure 5:
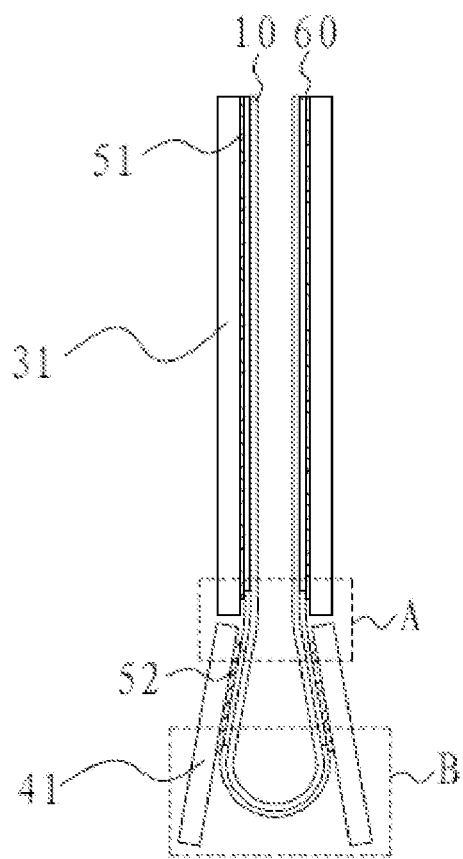
FIG. 5 is a schematic view showing an adhesive material is applied to a hard layer in accordance with an embodiment of the present invention.
Figure 6:
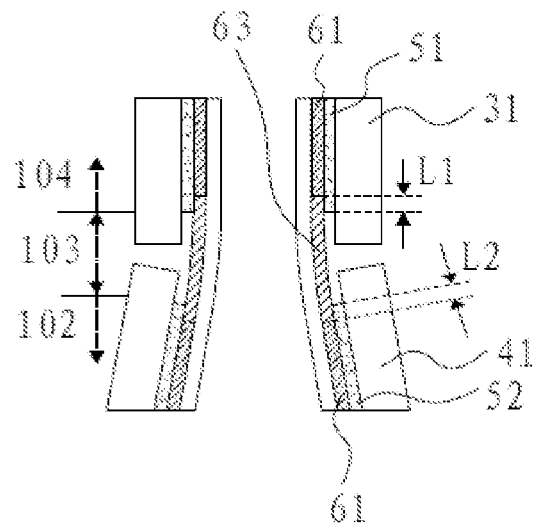
FIG. 6 is a schematic enlarged view of an A portion indicated in FIG. 5.
Figure 7:
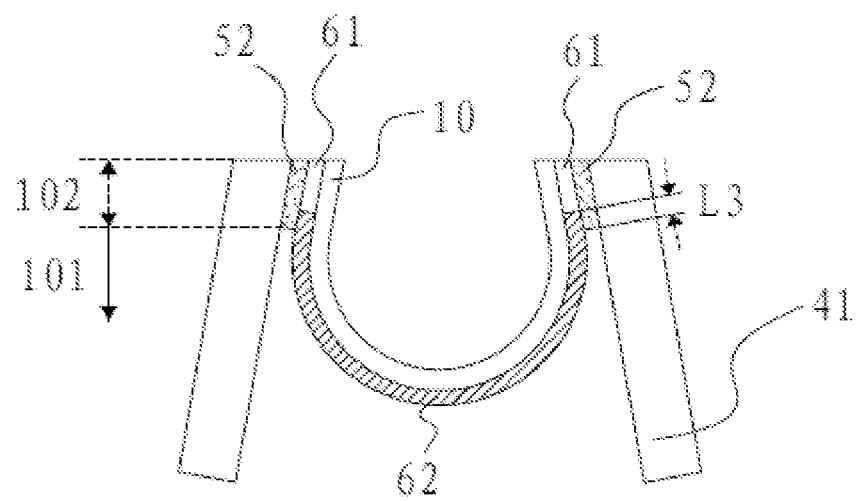
FIG. 7 is a schematic enlarged view of a B portion indicated in FIG. 5.

Please refer to FIGS. 5 to 7. In one embodiment, a hard layer 60 is disposed on a side of the flexible display 10 facing away from the display surface to improve flatness and ease of assembly of the flexible display 10.

Specifically, the hard layer 60 includes a first hard layer 61 located in the non-bend area, a second hard layer 62 located in the inward-bend area 101, and a third hard layer 63 located in the outward-bend area 103.

In one embodiment, the hard layer 60 may be made of a metal material, or other material for support purposes.

In one embodiment, the adhesive material 50 includes a first adhesive material 51 and a second adhesive material 52. The first adhesive material 51 is applied between part of the first hard layer 61 located in the second non-bend area 104 and the top surface of a correspond one of the support housings 30. The second adhesive material 52 is applied between part of the first hard layer 61 located in the first non-bend area 102 and the corresponding one of the support plates 41.

End portions of adhesive materials in different bend areas may be spaced apart at predetermined distances from end portions of corresponding hard layers. With the predetermined distances, adhesive lamination effects can be guaranteed, as well as reducing requirements for fitting accuracy.

Specifically, please refer to FIG. 6. A vertical distance L1 between an end portion of the first adhesive material 51 adjacent to the outward-bend area 103 and an end portion of the adjacent third hard layer 63 is between −3 mm and 3 mm A vertical distance L2 between an end portion of the second adhesive material 52 adjacent to the outward-bend area 103 and an end portion of the adjacent third hard layer 63 is between −3 mm and 3 mm.

Please refer to FIG. 7. A vertical distance L3 between an end portion of the second adhesive material 52 adjacent to the inward-bend area 101 and an end portion of the adjacent second hard layer 62 is between −5 mm and 3 mm.

When the vertical distances L1, L2, and L3 are positive values, it means that the end portions of the first and second adhesive materials 51 and 52 are extending beyond the end portions of the corresponding second and third hard layers 62 and 63. When the vertical distances L1, L2, and L3 are zero, it means that the end portions of the first and second adhesive materials are flush with the end portions of the corresponding second and third hard layers. When the vertical distances L1, L2, and L3 are negative values, it means that the end portions of the corresponding hard layers are extending beyond the end portions of the corresponding adhesive materials.

Since the first hard layer 61 is disposed in the non-bend area not for bending, the first hard layer 61 can be configured with an entire complete surface. Specifically, the first hard layer 61 may be a metal layer deposited on an entire surface of the non-bend area.

The second hard layer 62 disposed in the inward-bend area 101 needs to bend inwards in conjunction with the flexible display 10, and therefore may be patterned to improve bending performance of the second hard layer 62, prevent the second hard layer 62 from being broken during repeated bending, and reduce stress on the flexible display 10 in the inward-bend area 101.

Specifically, please refer to FIGS. 8A-8D. A plurality of through holes 621 are formed on the second hard layer 62, so that the second hard layer 62 is configured with a grid pattern. The through holes may be round, diamond, square, or polygonal in shape.

Figure 8A:
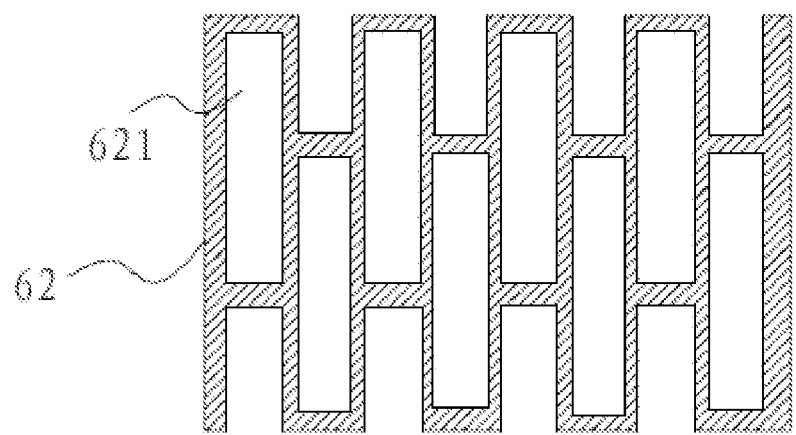
FIGS. 8A to 8D are schematic views of a second hard layer in accordance with an embodiment of the present invention.

In one embodiment, as shown in FIG. 8A, the second hard layer 62 may be a bar-like metal mesh.

Figure 8B:
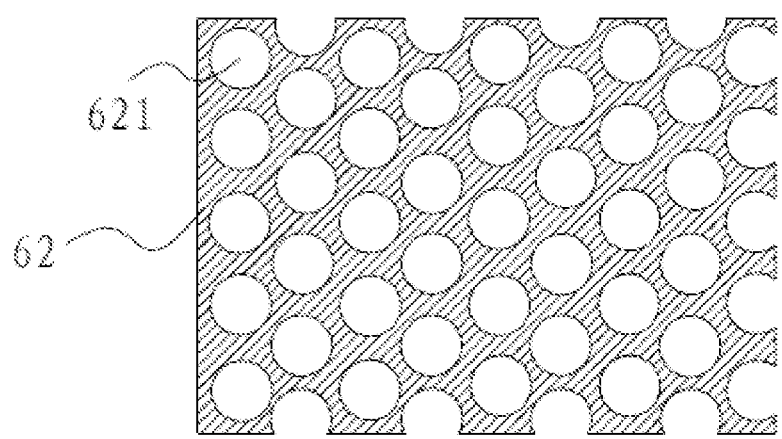

In one embodiment, as shown in FIG. 8B, the second hard layer 62 may be a round-like metal mesh.

Figure 8C:
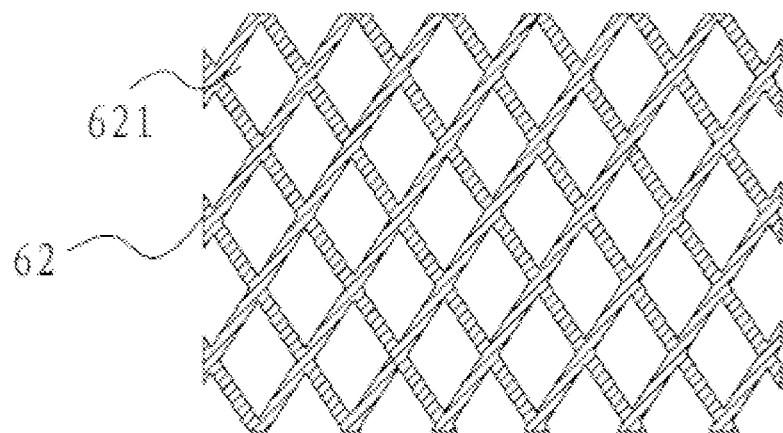

In one embodiment, as shown in FIG. 8C, the second hard layer 62 may be a diamond-like metal mesh.

Figure 8D:
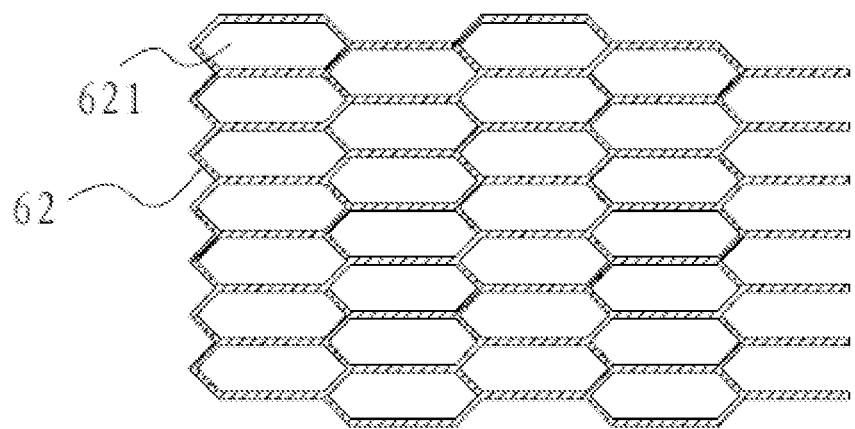

In one embodiment, as shown in FIG. 8D, the second hard layer 62 may be a hexagon-like metal mesh.

Figure 9:
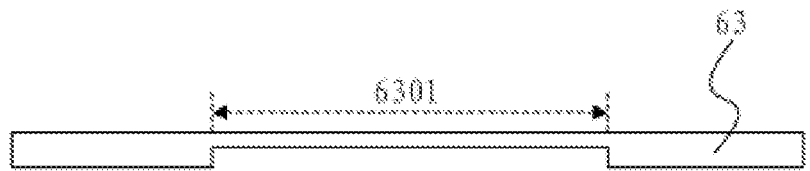
FIG. 9 is a schematic view of a third hard layer in accordance with an embodiment of the present invention.

Since the third hard layer 63 located in the outward-bend area 103 needs not only to improve its outwardly bending performance, but also to take into account its own stiffness, the better the stiffness of the third hard layer 63 is, the less the risk of peeling internal film layers of the flexible display 10 in a bending process is. Therefore, the third hard layer 63 may be configured with a thickness-reduced area 6301 in a certain region, wherein the thickness-reduced area 6301 has a thickness no greater than 0.1 mm Please refer to FIG. 9. Since a central area of the outward-bend area 103 has a largest bending angle, the thickness-reduced area can be arranged in a middle of the third hard layer 63. Specifically, a thickness of the thickness-reduced area 6301 is less than a thickness of the first hard layer 61.

Figure 10:
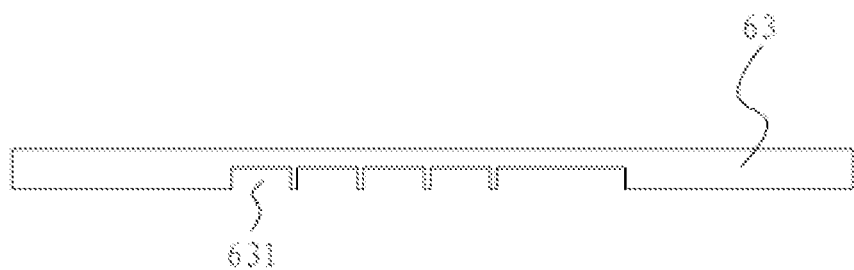
FIG. 10 is a schematic view of a third hard layer in accordance with another embodiment of the present invention.

In another embodiment, please refer to FIG. 10. A blind hole formation process can be implemented on a side of the third hard layer 63 facing away from the flexible display 10. That is, the third hard layer 63 is configured with a plurality of blind holes 631. The third hard layer 63 corresponding to position of the blind holes 631 has a thickness no less than 0.01 mm.

A hole formation rate of the third hard layer 63 is no greater than 70%. The hole formation rate here refers to a ratio of an area of blind hole formation to an area of an entire cyclic pattern unit in one cyclic pattern unit of the third hard layer 63.

In the above-mentioned embodiments, the description of each embodiment has its own focus. For parts that are not described in detail in an embodiment, reference may be made to related descriptions of other embodiments.

Accordingly, each of the support plates 41 rotates with respect to the corresponding one of the support housings 30 when folding the foldable display device 100 in half, so that the two support plates 41 on two sides of the intermediate casing 20 tilt to be wedge-like in shape to form a collision avoidance space for accommodating the bend end 11 of the flexible display 10, thereby reducing damage to the flexible display 10 due to crush. In addition, part of each of the support plates 41 is kept in a straight adhesion state with the flexible display 10 to provide well support for the flexible display when the foldable display device 100 is being folded in half, and the support plates 41 after being expanded are configured to provide an entire surface support for the bend area of the flexible display 10 when the foldable display device 100 is in an expanded state. Furthermore, a rear surface of the flexible display 10 is provided with the hard layer 60, which is formed with a through hole pattern structure corresponding to position of the inward-bend area 101. In addition, the hard layer 60 in the outward-bend area 103 is processed to reduce thickness or is formed with a blind hole pattern structure, so that the hard layer in both the inward-bend area 101 and the outward-bend area 103 can meet requirements for bending in various directions.

It can be understood that, for those of ordinary skill in the art, equivalent replacements or changes can be made according to the technical solution of the present application and its inventive concept, and all these changes or replacements shall fall within the protection scope of the appended claims of the present application.

What is claimed is:

1. A foldable display device, comprising:
a flexible display;
an intermediate casing disposed on a side of the flexible display away from a display surface of the flexible display;
a bend area and a non-bend area, wherein the bend area includes an inward-bend area and two outward-bend areas located at two sides of the inward-bend area, part of the flexible display located in the inward-bend area bends in a direction of the display surface, and part of the flexible display located in the outward-bend areas bends in a direction facing away from the display surface;
two support housings disposed on two opposite sides of the intermediate casing, respectively, and each of the support housings rotatably connected to the intermediate casing; and
a rotating assembly disposed between the intermediate casing and each of the support housings, wherein one end of the rotating assembly is rotatably connected to a corresponding one of the support housings, another end is a free end extending to an inside of the intermediate casing, and the support housings and the rotating assemblies cooperatively support the flexible display, wherein the rotating assembly comprises a support plate configured to support the flexible display, one end of the support plate is rotatably connected to the corresponding one of the support housings, and another end of the support plate extends to the inside of the intermediate casing;
wherein a hard layer is disposed on a side of the flexible display facing away from the display surface, and the hard layer comprises a first hard layer located in the non-bend area, a second hard layer located in the inward-bend area, and a third hard layer located in the outward-bend area, wherein the first hard layer is arranged on an entire surface of the non-bend area, the second hard layer is configured with at least a through hole, and the third hard layer is configured with at least a blind hole;
wherein the two support housings are rotatable about the intermediate casing, the rotating assembly is rotatable with respect to the corresponding one of the support housings and the intermediate casing, and the free end of the rotating assembly rotates in a direction adjacent to an inner wall of the intermediate casing when folding the foldable display device, so that the rotation of the two rotating assemblies allows for a collision avoidance space for accommodating a bend end of the flexible display.

2. The foldable display device of claim 1, wherein the rotating assembly is accommodated in a space formed by the corresponding one of the support housings and the intermediate casing.

3. The foldable display device of claim 1, wherein the non-bend area comprises a first non-bend area and a second non-bend area, one end of the inward-bend area is connected to the outward-bend area on a same side on which the inward-bend area is located through the first non-bend area, a first adhesive material is applied between part of the first hard layer located in the second non-bend area and a top surface of a correspond one of the support housings, and a second adhesive material is applied between part of the first hard layer located in the first non-bend area and the corresponding one of the support plates.

4. The foldable display device of claim 3, wherein a vertical distance between an end portion of the first adhesive material adjacent to the outward-bend area and an end portion of the adjacent third hard layer is between −3 and 3 millimeters (mm), a vertical distance between an end portion of the second adhesive material adjacent to the outward-bend area and an end portion of the adjacent third hard layer is between −3 and 3 mm, and a vertical distance between an end portion of the second adhesive material adjacent to the inward-bend area and an end portion of the adjacent second hard layer is between −5 and 3 mm.

5. The foldable display device of claim 1, wherein the support plate has a free end extending to the intermediate casing, and the free end of the support plate rotates in the direction adjacent to the inner wall of the intermediate casing when folding the foldable display device.

6. A foldable display device, comprising:
a flexible display;
an intermediate casing disposed on a side of the flexible display away from a display surface of the flexible display;
two support housings disposed on two opposite sides of the intermediate casing, respectively, and each of the support housings rotatably connected to the intermediate casing; and
a rotating assembly disposed between the intermediate casing and each of the support housings, wherein one end of the rotating assembly is rotatably connected to a corresponding one of the support housings, another end is a free end extending to an inside of the intermediate casing, and the support housings and the rotating assemblies cooperatively support the flexible display, wherein the rotating assembly comprises a support plate configured to support the flexible display, one end of the support plate is rotatably connected to the corresponding one of the support housings, and another end of the support plate extends to the inside of the intermediate casing;
wherein the two support housings are rotatable about the intermediate casing, the rotating assembly is rotatable with respect to the corresponding one of the support housings and the intermediate casing, and the free end of the rotating assembly rotates in a direction adjacent to an inner wall of the intermediate casing when folding the foldable display device, so that the rotation of the two rotating assemblies allows for a collision avoidance space for accommodating a bend end of the flexible display;
wherein each of the support housings is provided with an arc-shaped slide groove therein, and the support plate comprises an arc-shaped end portion matching the arc-shaped slide groove, so that the arc-shaped end portion is slidable along the arc-shaped slide groove, and the support plate has a rotation center defined as a center of the arc-shaped slide groove.

7. The foldable display device of claim 6, wherein the arc-shaped slide groove is fixedly connected to a top surface of the support housing.

8. The foldable display device of claim 6, wherein the rotating assembly further comprises a rotation plate rotatably connected to the support plate, one end of the rotation plate is rotatably connected to the intermediate casing, and the support plate rotates against the rotation plate in a linear direction.

9. The foldable display device of claim 8, wherein each of the support housings is pivotally connected to the intermediate casing, and the rotation plate is pivotably connected to the intermediate casing.

10. The foldable display device of claim 6, wherein the rotating assembly is accommodated in a space formed by the corresponding one of the support housings and the intermediate casing.

\* \* \* \* \*